United States Patent
Tinker

(10) Patent No.: US 9,571,265 B2
(45) Date of Patent: Feb. 14, 2017

(54) SAMPLE RATE CONVERTER WITH SAMPLE AND HOLD

(71) Applicant: Tempo Semiconductor, Inc., Austin, TX (US)

(72) Inventor: Darrell Eugene Tinker, Austin, TX (US)

(73) Assignee: Tempo Semicondutor, Inc., Austin, TX (US)

( * ) Notice: Subject to any disclaimer, the term of this patent is extended or adjusted under 35 U.S.C. 154(b) by 0 days.

(21) Appl. No.: 14/873,410

(22) Filed: Oct. 2, 2015

(65) Prior Publication Data

US 2017/0012767 A1 Jan. 12, 2017

Related U.S. Application Data

(60) Provisional application No. 62/190,858, filed on Jul. 10, 2015.

(51) Int. Cl.
*H04L 7/00* (2006.01)
*H04L 7/033* (2006.01)

(52) U.S. Cl.
CPC .......... *H04L 7/0087* (2013.01); *H04L 7/0331* (2013.01)

(58) Field of Classification Search
CPC .... H04L 7/0087; H04L 7/0331; H04L 7/0083; H04L 7/027; H04L 27/1566

USPC .......... 375/350, 354–355; 370/503
See application file for complete search history.

(56) References Cited

U.S. PATENT DOCUMENTS

| | | | | |
|---|---|---|---|---|
| 5,732,044 A * | 3/1998 | Jarvis | ..................... | H04B 11/00 367/134 |
| 6,724,847 B1 * | 4/2004 | Kallman | ............... | H04L 7/0029 329/345 |
| 8,526,623 B2 * | 9/2013 | Franck | ........................... | 381/17 |
| 9,137,006 B1 * | 9/2015 | Wohlrab | ............... | H04L 7/0029 |
| 2008/0219331 A1 * | 9/2008 | Liang | ................... | H04B 1/0475 375/219 |
| 2010/0144333 A1 * | 6/2010 | Kiasaleh | ............. | H04B 1/0003 455/418 |

\* cited by examiner

*Primary Examiner* — Khanh C Tran
(74) *Attorney, Agent, or Firm* — Jeffrey Van Myers; Artie A. Pennington

(57) ABSTRACT

A sample rate converter for an oversampled data stream develops interpolated samples at a first oversample rate, from samples at a second oversample rate; wherein the first oversample rate is a non-integer multiple of the second oversample rate. When the samples at the second oversample rate are changing state, at least two interpolated samples are generated or the interpolation is at least second order. When the sample at the second oversample rate is not changing state, the sample at the second oversample rate is passed substantially unchanged. In one embodiment of the invention, asynchronous sample rate conversion is performed, and the first oversample rate is a varying non-integer multiple of the second oversample rate.

9 Claims, 3 Drawing Sheets

SAMPLE RATE CONVERTER WITH SAMPLE AND HOLD

CROSS REFERENCE TO RELATED APPLICATIONS

This application is related to the following:
1. Provisional Application Ser. No. 62/190,858, filed 10 Jul. 2015 ("Parent Provisional").

This application claims priority to the Parent Provisional, and hereby claims benefit of the filing date thereof pursuant to 37 CFR §1.78(a)(4).

The subject matter of the Parent Provisional, in its entirety, is expressly incorporated herein by reference.

BACKGROUND OF THE INVENTION

1. Field of the Invention

The present invention relates to a sample rate converter for use with digital-to-analog conversion circuits and the like.

2. Description of the Related Art

In general, in the descriptions that follow, I will italicize the first occurrence of each special term of art that should be familiar to those skilled in the art of integrated circuits ("ICs") and systems. In addition, when I first introduce a term that I believe to be new or that I will use in a context that I believe to be new, I will bold the term and provide the definition that I intend to apply to that term. In addition, throughout this description, I will sometimes use the terms assert and negate when referring to the rendering of a signal, signal flag, status bit, or similar apparatus into its logically true or logically false state, respectively, and the term toggle to indicate the logical inversion of a signal from one logical state to the other. Alternatively, I may refer to the mutually exclusive boolean states as logic_0 and logic_1. Of course, as is well known, consistent system operation can be obtained by reversing the logic sense of all such signals, such that signals described herein as logically true become logically false and vice versa. Furthermore, it is of no relevance in such systems which specific voltage levels are selected to represent each of the logic states.

Hereinafter, when I refer to a facility I mean a circuit or an associated set of circuits adapted to perform a particular function regardless of the physical layout of an embodiment thereof. Thus, the electronic elements comprising a given facility may be instantiated in the form of a hard macro adapted to be placed as a physically contiguous module, or in the form of a soft macro the elements of which may be distributed in any appropriate way that meets speed path requirements. In general, electronic systems comprise many different types of facilities, each adapted to perform specific functions in accordance with the intended capabilities of each system. Depending on the intended system application, the several facilities comprising the hardware platform may be integrated onto a single IC, or distributed across multiple ICs. Depending on cost and other known considerations, the electronic components, including the facility-instantiating IC(s), may be embodied in one or more single- or multi-chip packages. However, unless I expressly state to the contrary, I consider the form of instantiation of any facility that practices my invention as being purely a matter of design choice.

Shown in FIG. 1 is a typical general purpose computer system 10. In particular, in recently-developed battery-powered mobile systems, such as smart-phones and the like, many of the discrete components typical of desktop or laptop devices illustrated in FIG. 1 are integrated into a single integrated circuit chip.

Shown by way of example in FIG. 2 is one embodiment of a single-chip audio coder/decoder ("CODEC") 12 comprising: a plurality of digital modules; and a plurality of analog modules. In this embodiment, CODEC 12 includes a Serial Data Interface facility adapted to send data to, and receive digital data from, the system 10; a Digital Phase-Locked Loop ("DPLL") facility adapted to determine the timing and rate relationship between two asynchronous data streams; a Configuration Memory and Control facility adapted to control which facilities are used and how, in accordance with configuration and control information received from the system 10; a Digital Signal Processor ("DSP") facility adapted to perform various data processing activities in accordance with a stored computer program; and a Data Memory facility adapted to store, as required, audio data flowing from the system 10 to the audio output devices. I may expand on the functionality of certain of these facilities as I now explain the method of operation of my invention and embodiments thereof.

Audio DACs commonly operate at oversample rates of 64, 80, 128, 160 or similar multiples of the input sample rate. Often the input data stream is interpolated to 4 or 8 times the input sample rate using a high quality digital filter to remove images, and then each sample is held a constant number of cycles at the oversample rate. The sample and hold facility produces images that are only partially filtered, but these images are outside the audio band, so are not a problem for most applications. Some DACs have incorporated sample rate conversion by allowing the oversample rate to be a non-integer multiple of the input sample rate. One known method to accomplish this is to vary the number of cycles at the output oversample rate that each 4× or 8× sample is held. For example, the system could alternate between holding each sample 8 or 9 cycles. This works well if the created images do not fall in the audio band, but will not produce good results for asynchronous sample rate conversion.

A second known method is to use linear interpolation to produce the oversampled data from the 4× or 8× data stream. This method can be used successfully even for asynchronous sample rate conversion if the oversample rate is a high enough multiple of the input sample rate. For example, if the oversample rate is about 128 times the input sample rate, and about 16 times the high quality 8× interpolated data stream, any images aliased into the audio band will be suppressed by at least 100 dB, and each doubling of the oversample rate will improve the image rejection by 12 dB. But this method will not produce good enough results for an audio DAC at an oversample rate of only about 64 times the input sample rate.

An improvement over the second known method is to use linear interpolation to produce a single interpolated sample of the oversampled data at each transition of the 8× interpolated data, and to hold the 8× sample in between transitions. This method achieves equivalent attenuation of aliased images in the baseband region as the second method, but with fewer calculations, for example, $\frac{1}{16}$ the number of interpolations at about a 128× oversample rate. I invented this method in 1999 while employed by SigmaTel, Inc. (Austin, Tex., USA), and at the present time, this method is, I believe, in the public domain.

What is needed is a sample rate converter that achieves superior oversample rate conversion more efficiently and effectively than the known art.

BRIEF SUMMARY OF THE INVENTION

In accordance with my invention, I provide a method adapted to develop from a stream of data sampled at a first oversample rate a resampled data stream resampled at a second oversampled rate, wherein the second oversample rate is a non-integer multiple of the first oversample rate. In one embodiment, my method first develops at least first, Nth and 2N-1st sample clock periods at the second oversample rate, and then receives first and second data stream samples at the first oversample rate, the first data stream sample transitioning to the second data stream sample during the Nth sample clock period. In response to the first sample clock period, I develop a first convolution value as a function of the received data stream sample and a first convolution function defined between the start of the first and the end of Nth sample clock periods. Then, in response to the Nth sample clock period, I develop a second convolution value as a function of the received data stream sample and a second convolution function defined between the start of the Nth and the end of the 2N-1 st sample clock periods. Finally, I provide as the resampled data stream: before the first sample clock period, the first data stream sample; during the first sample clock period, the first convolution value at the transition of the first data stream sample to the second data stream sample; during the Nth sample clock period, the second convolution value at the transition of the first data stream sample to the second data stream sample; and, after the Nth sample clock period, the second data stream sample.

In accordance with another embodiment of my invention, a sample rate converter may be adapted to practice my sample rate conversion method.

In accordance with yet another embodiment of my invention, an electronic system may comprise a sample rate converter adapted to practice my sample rate conversion method.

In accordance with still another embodiment of my invention, a computer readable medium may include executable instructions which, when executed in a processing system, causes the processing system to perform the steps of my sample rate conversion method.

BRIEF DESCRIPTION OF THE SEVERAL VIEWS OF THE DRAWINGS

My invention may be more fully understood by a description of certain preferred embodiments in conjunction with the attached drawings in which.

Figure 1:
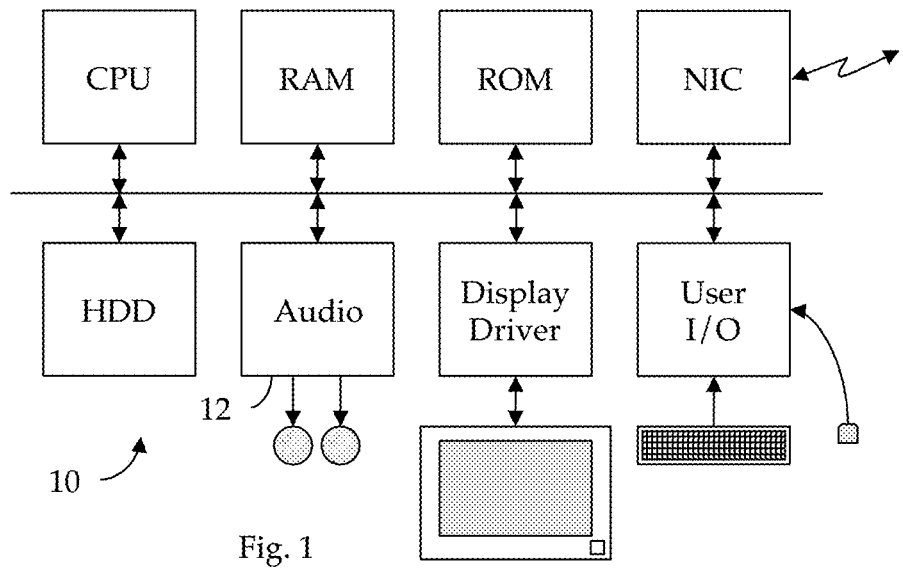
FIG. 1 illustrates, in block diagram form, a general purpose computer system adapted to practice my invention.
Figure 2:
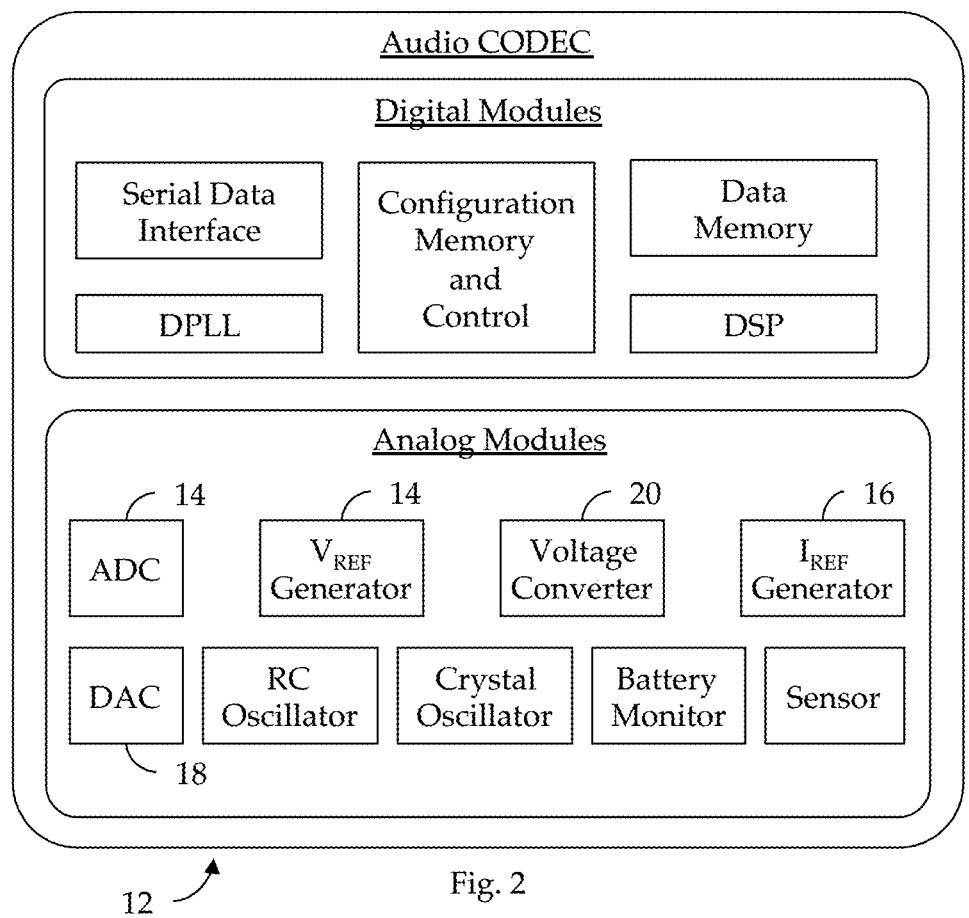
FIG. 2 illustrates, in block diagram form, a typical integrated system adapted to practice my invention.

In the drawings, similar elements will be similarly numbered whenever possible. However, this practice is simply for convenience of reference and to avoid unnecessary proliferation of numbers, and is not intended to imply or suggest that my invention requires identity in either function or structure in the several embodiments.

DETAILED DESCRIPTION OF THE INVENTION

I have developed a method to achieve better than 133 dB attenuation of aliased images when doing asynchronous sample rate conversion at about a 64× oversample rate, and with the image rejection improving by 18 dB for each doubling of the oversample rate. The essence of my method is to produce two or more interpolated samples at each transition of the sample/hold data, but to pass the sample/hold value unchanged for all other sample times at the output oversample rate. If two samples are produced at each transition, a second-order interpolation method is used. If more samples are produced, a higher order interpolation method is used. However, I believe that second-order interpolation is sufficient in most applications to produce the 133 dB performance level at a 64× oversample rate.

Figure 3:
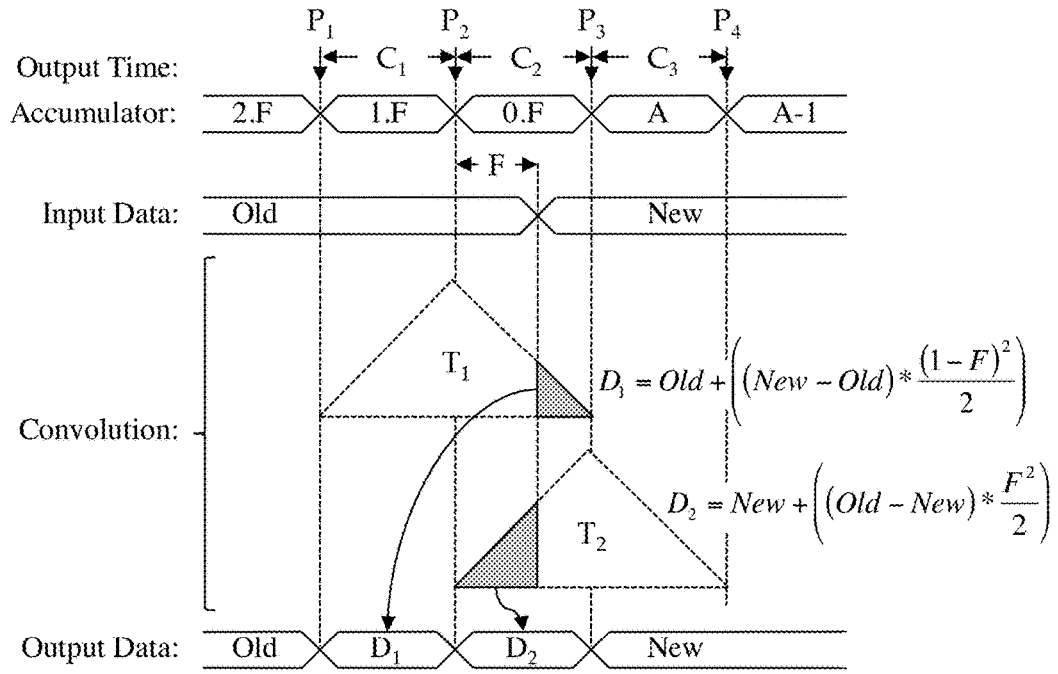
FIG. 3 illustrates, in time line format, one method of performing a sample rate conversion in accordance with my invention.

FIG. 3 shows a conceptual, graphical representation of my second-order interpolation method. An accumulator (see, FIG. 4), with both an integer and a fraction part, counts down by 1 each clock period, $C_x$, at the output oversample rate. The sample/hold data changes state at the time when the accumulator would be exactly equal to 1 if it was counting down continuously, but since it only counts down at the output oversample clock pulses, $P_x$, the mathematical position of the transition is given by the fractional value, F, of the accumulator (see, below). So in FIG. 3, the fractional value F identifies the point where the sample/hold mathematically changes state. Note, however, that this time point as depicted in FIG. 3 is a mathematical abstraction, and is not intended to represent the actual time that the signal in the circuit changes, i.e., the actual transition time will depend on the implementation details of the circuit.

A series of interpolation isosceles triangles, $T_x$, of height 1 and width 2 follows the count sequence, centered, conceptually, at a respective oversample clock pulse, $P_{x+1}$. Note that the area of each triangle, $T_x$, is unity. The output of each interpolation, $D_x$, is the triangle $T_x$ convolved with the current sample/hold input data value, meaning that each portion of area of the triangle $T_x$ is multiplied by the value of the sample/hold input data directly above it in the figure. Thus, for the example shown in FIG. 3, at clock pulse $P_1$, the triangle $T_0$ (not shown) would completely overlap with the Old value, and, at clock pulse $P_4$ the triangle $T_3$ (also not shown) would completely overlap with the New value. So the output value, D, at these times is respectively the Old value and the New value. But at clock pulses $P_2$ and $P_3$, the interpolation triangles $T_1$ and $T_2$, respectively, overlap both the Old and New values, so the interpolated values are given by the following calculations:

$$D_1 = \text{Old} + \left( (\text{New} - \text{Old}) \times \frac{(1-F)^2}{2} \right) \quad [\text{Eq. 1}]$$

$$D_2 = \text{New} - \left( (\text{New} - \text{Old}) \times \frac{F^2}{2} \right) \quad [\text{Eq. 2}]$$

In accordance with one embodiment of my invention, the cycle after the integer part of the accumulator is zero, the accumulator is adjusted up by a Rate value instead of being decremented. The Rate value represents the number of cycles minus 1 at the oversample rate until the next transition of the sample/hold input data. The Rate value has both an integer part and a fraction part, and may be either a constant value or a variable. If the oversample rate is an exact multiple of the sample/hold rate, the fraction part will be zero. For an asynchronous sample rate converter, the Rate value is variable, and is controlled by a DPLL or its equivalent.

Figure 4:
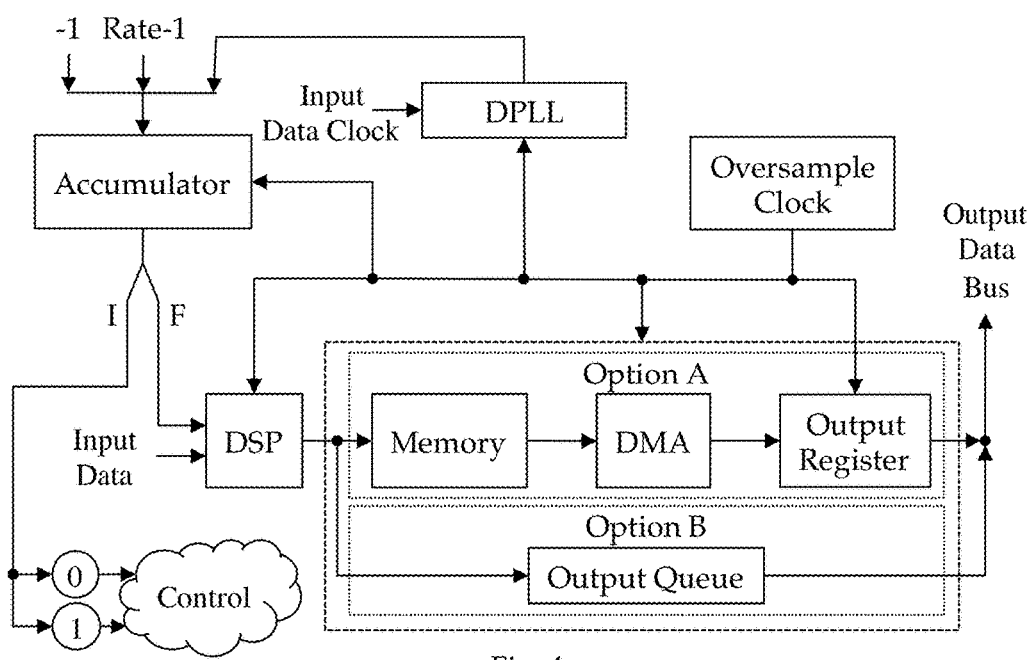
FIG. 4 illustrates, in block diagram form, one embodiment for implementing the method of FIG. 3.

FIG. 4 illustrates one hardware embodiment of my invention. An Oversample Clock keeps each part synchronized to the output sample rate. An Accumulator determines when new input data is needed, based on the supplied Rate value, which can be a constant or a variable. For asynchronous sample rate conversion, the Rate value is varied to keep the need for input data synchronized with the supply of input data. The Accumulator has both an integer ("I") and a fraction ("F") part, and is decremented by 1 each cycle, except that when the integer part is zero, the Rate value minus 1 is added instead. Comparators determine when the integer part is one or zero, so that Control can control the Accumulator, a Digital Signal Processor ("DSP"), and the output data value path. Optionally, the output data values developed by the DSP can be serially stored in a Memory and retrieved as needed by a Direct Memory Access ("DMA") facility for output to an Output Data Bus via an Output Register ("Option A"), or forwarded via an Output Queue directly to the Output Data Bus ("Option B").

The fraction part of the Accumulator can only change when the integer part of the Accumulator is zero, at the time the Rate value is added. When the new input data is available after this, the DSP can begin calculating the two (or more) interpolated samples as soon as the fraction is updated. The calculated samples are then saved in the memory (Option A) or the Output Queue (Option B) to be asserted on the Output Data Bus at the correct time. The first interpolated sample is driven on the Output Data Bus when the integer part of the Accumulator is one, and the second interpolated sample is driven on the Output Data Bus when the integer part of the Accumulator is zero. In the next oversampled rate clock cycle, the new input data value that was used to calculate the two interpolated samples is driven on to the Output Data Bus.

In Option A, the data and interpolated samples are read from the Memory by the DMA at the correct time, and loaded into the Output Register. The first interpolated sample is read when the integer part of the Accumulator is one, the second interpolated sample is read when the integer part of the Accumulator is zero, and the new input data is read in the next cycle. In Option B, the interpolated samples are loaded by the DSP into the Output Queue at the time they are generated by the DSP, followed by the new input data sample, and the Output Queue is advanced at the correct time based on the Accumulator value and oversample rate clock. A Output Queue depth of 4 would be enough to allow the DSP to calculate two interpolated samples and load the new input data sample while the old input data sample is still being driven on the Output Data Bus.

In some embodiments, the DSP may be clocked at a rate higher than the oversample rate clock, in order to complete the interpolation and other processing tasks in a timely manner.

Note that FIG. 3 is conceptual and does not correspond to the timing of the signals in an actual hardware instantiation. In one embodiment, the output data timing may resemble FIG. 3, but perhaps shifted in time. Further, the triangles are "synchronized" only conceptually, in order to facilitate understanding of how the formulas for calculating the output sample values at times $D_{N-1}$ and $D_N$ are derived. An actual hardware instantiation only has to implement the derived formulas to calculate the samples. The point in time at which the hardware is synchronized with the output data stream is within the DMA when reading the precalculated samples from the memory and loading them in the Output Register (Option A), or at the output of the Output Queue (Option B). In one embodiment, the next fractional part, F, of the Accumulator is available as soon as the Accumulator is updated by adding the "rate" value at the time the integer part, I, is zero. Because the Accumulator is decremented by integer values, the fraction does not change again until the next time the rate value is added. Also, in some embodiments, the new Input Data value may be available for calculation earlier than the conceptual transition from Old to New in the Output Data stream. This allows the samples for times $D_{N-1}$ and $D_N$ to be pre-calculated and saved in the Memory (Option A) or Output Queue (Option B) to be used at the correct time. For each New sample in the Input Data stream, 3 values will be output on the Output Data stream: $D_{N-1}$, $D_N$, and New, but New is just a copy of the latest Input Data sample, so only two samples have to be calculated. In one embodiment of an asynchronous sample rate converter, the conceptual Old-to-New transition location may be controlled by a DPLL, as it adjusts the Rate value that is added to the Accumulator, but the New data may arrive sooner.

Figure 5:
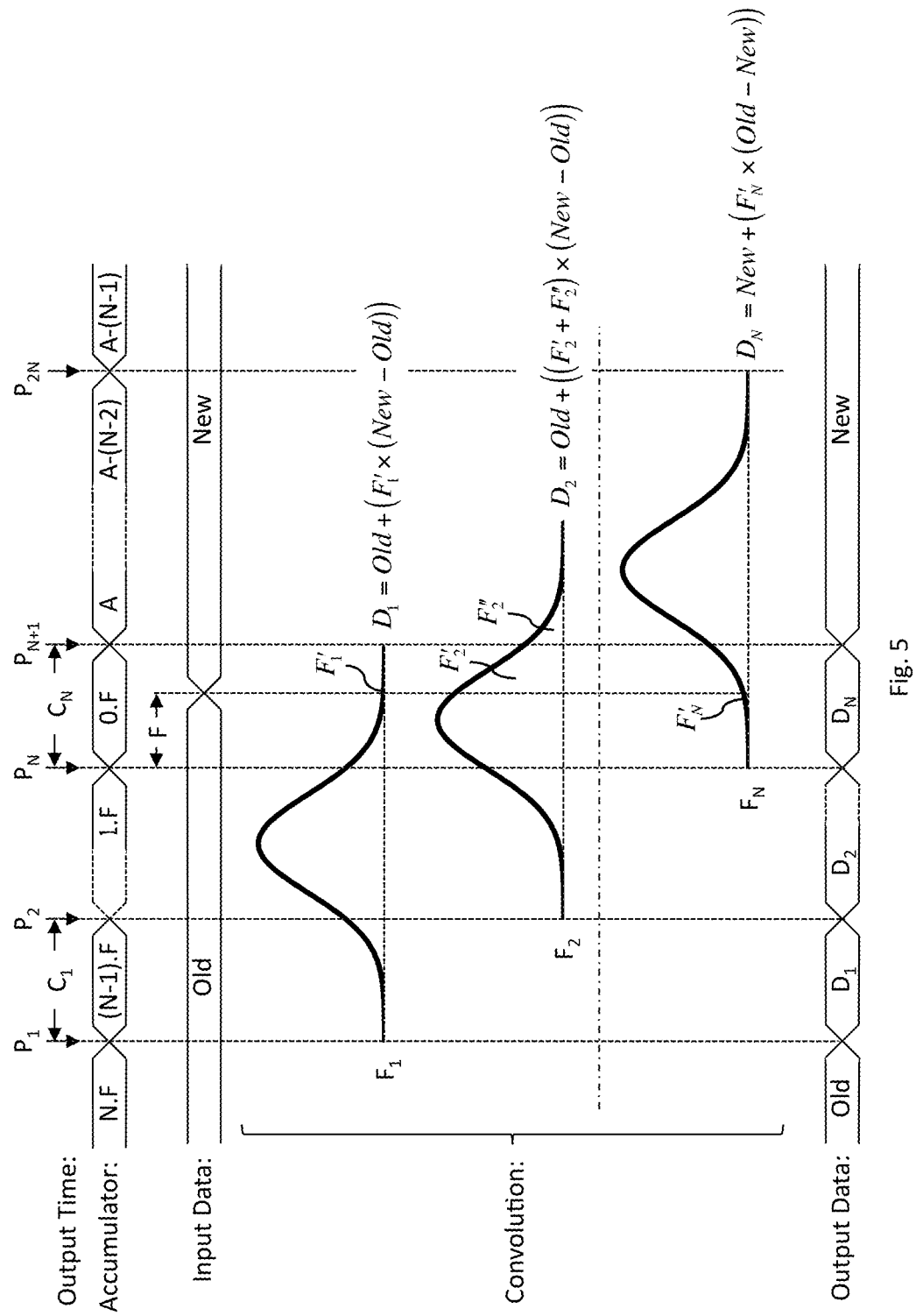
FIG. 5 illustrates, in time line format, one other, higher-order method of performing a sample rate conversion in accordance with my invention.

In accordance with my invention, each of the convolutions may be of a selected order, wherein the shape being convolved with the Input Data is two or more clock periods wide. For the 2nd-order case illustrated in FIG. 3, the shape is piecewise linear, i.e., a 2-cycle wide triangle. For an embodiment implementing a 3rd-order convolution, the shape may be piecewise parabolic, i.e., 3 clock periods wide. In the general case illustrated in FIG. 5, the respective interpolation shape is derived by convolving a unit square with the next lower order interpolation shape. Thus, for example, an interpolation triangle is two squares convolved, a 3rd-order interpolation shape would be a triangle convolved with a square, and so on for even higher orders. As the order increases, the interpolation shape becomes a closer approximation to a Gaussian curve. In most audio applications, I believe that the 2nd-order method illustrated in FIG. 3 is adequate, because it is simpler than higher orders, while still meeting the quality requirements for audio. However, 3rd-order and higher methods may be useful for other applications. These higher order methods may be distinguished from prior art by the use of the sample-and-hold in between the calculated samples. e.g., n calculated samples for an nth-order interpolation. In general, the formulas for calculating the interpolated samples can be derived by mathematical methods without resorting to the graphical convolution methods shown in FIG. 3 and FIG. 5. For example, a polynomial interpolation method, such as La Grange interpolation can derive the formulas. What particularly distinguishes my method from prior art is holding the new sample until the next calculated samples are used, so the set of calculations is performed once for each input sample, rather than once for each output sample.

Although I have described my invention in the context of particular embodiments, one of ordinary skill in this art will readily realize that many modifications may be made in such embodiments to adapt either to specific implementations. In accordance with another embodiment of my invention, a sample rate converter facility may be adapted to practice my sample rate conversion method. In accordance with yet another embodiment of my invention, an electronic system may comprise a sample rate converter adapted to practice my sample rate conversion method. In accordance with still another embodiment of my invention, a computer readable medium may include executable instructions which, when executed in a processing system, causes the processing system to perform the steps of my sample rate conversion method. Thus it is apparent that I have provided a sample rate converter that achieves oversample rate conversion effectively and efficiently. Further, I submit that my method and apparatus provide performance generally superior to the best prior art techniques.

What I claim is:

1. A method adapted to develop from a stream of data sampled at a first oversample rate a resampled data stream resampled at a second oversampled rate, wherein the second oversample rate is a non-integer multiple of the first oversample rate, the method comprising the steps of:

1.1 developing at least first, second and third sample clock periods at the second oversample rate;

1.2 receiving first and second data stream samples at the first oversample rate, the first data stream sample transitioning to the second data stream sample during the second sample clock period;

1.3 in response to the first sample clock period, developing a first convolution value as a function of the received data stream sample and a first convolution function defined between the start of the first and the end of second sample clock periods;

1.4 in response to the second sample clock period, developing a second convolution value as a function of the received data stream sample and a second convolution function defined between the start of the second and the end of the third sample clock periods; and 1.5 providing as the resampled data stream:

1.5.1 before the first sample clock period, the first data stream sample;

1.5.2 during the first sample clock period, the first convolution value at the transition of the first data stream sample to the second data stream sample;

1.5.3 during the second sample clock period, the second convolution value at the transition of the first data stream sample to the second data stream sample; and 1.5.4 after the second sample clock period, the second data stream sample.

2. The method of claim 1 wherein the first, second and third sample clock periods are consecutive in time.

3. The method of claim 1 wherein the first convolution function is defined as a triangle of unity area.

4. The method of claim 3 wherein the first convolution function is defined as an isosceles triangle of unity area.

5. The method of claim 1 wherein the second sample clock period is N sample clock periods after the first sample clock period, and the third sample clock period is N sample clock periods after the second sample clock period.

6. The method of claim 5 wherein N is at least 1.

7. A sample rate converter facility configured to perform the method of any preceding claim.

8. An electronic system comprising a sample rate converter facility according to claim 7.

9. A non-transitory computer readable medium including executable instructions which, when executed in a processing system, causes the processing system to perform the steps of a method according to any one of claims 1 to 8.

* * * * *